(12) United States Patent
Ikeda et al.

(10) Patent No.: US 8,373,210 B2
(45) Date of Patent: Feb. 12, 2013

(54) SEMICONDUCTOR DEVICE AND SEMICONDUCTOR DEVICE MANUFACTURING METHOD

(75) Inventors: Hiroaki Ikeda, Chuo-ku (JP); Mitsuru Shiozaki, Higashi-Hiroshima (JP); Atsushi Iwata, Higashi-Hiroshima (JP)

(73) Assignee: Elpida Memory, Inc., Tokyo (JP)

( * ) Notice: Subject to any disclaimer, the term of this patent is extended or adjusted under 35 U.S.C. 154(b) by 413 days.

(21) Appl. No.: 12/755,854

(22) Filed: Apr. 7, 2010

(65) Prior Publication Data
US 2010/0308434 A1 Dec. 9, 2010

(30) Foreign Application Priority Data
Apr. 8, 2009 (JP) .................................. 2009-093791

(51) Int. Cl.
*H01L 21/02* (2006.01)
(52) U.S. Cl. .......... 257/275; 257/E21.421; 257/E33.039

(58) Field of Classification Search .......... 257/275–298, 257/E21.429, 586, 27.121, 33.039
See application file for complete search history.

(56) References Cited

U.S. PATENT DOCUMENTS

| 2003/0107060 A1* | 6/2003 | Ota et al. ...................... 257/275 |
| 2004/0075491 A1* | 4/2004 | Kushitani et al. ................ 330/51 |
| 2005/0017824 A1* | 1/2005 | Hirabayashi .................. 333/204 |
| 2007/0241839 A1* | 10/2007 | Taniguchi ..................... 333/185 |

FOREIGN PATENT DOCUMENTS

| JP | 2002-100733 A | 4/2002 |
| JP | 2003-203982 A | 7/2003 |
| JP | 2005-203657 A | 7/2005 |

* cited by examiner

*Primary Examiner* — Michael Lebentritt
(74) *Attorney, Agent, or Firm* — Sughrue Mion, PLLC

(57) ABSTRACT

A semiconductor device includes a pair of electromagnetically coupled inductors. Each of the inductors is comprised of a plurality of through electrodes which extend through a semiconductor substrate, and wires which connect the plurality of through electrodes in series.

19 Claims, 18 Drawing Sheets

17 ELECTRODE MADE OF Ni
(COMMON TO INDUCTANCE AND THROUGH WIRE)

SEMICONDUCTOR DEVICE AND SEMICONDUCTOR DEVICE MANUFACTURING METHOD

This application is based upon and claims the benefit of priority from Japanese patent application No. 2009-93791, filed on Apr. 8, 2009, the disclosure of which is incorporated herein in its entirety by reference.

BACKGROUND OF THE INVENTION

1. Field of the Invention

The present invention relates to a semiconductor device and a semiconductor device manufacturing method, and more particularly, to a semiconductor device which comprises inductors, and a method of manufacturing the same.

2. Description of Related Art

For operating a plurality of logic chips in tandem with one another, it is necessary to synchronize operations of the plurality of logic chips with one another to smoothly transmit/receive signals among the plurality of logic chips.

For synchronizing operations of respective logic chips with one another and transmitting/receiving signals among logic chips under a circumstance where the respective logic chips operate with different supply voltages, a non-contact type signal transmission/reception scheme using capacitors or inductors is desirable in order to avoid problems associated with the transmission/reception of signals caused by the difference in supply voltage. In particular, the non-contact type signal transmission/reception scheme is useful for a semiconductor device which comprises stacked logic chips, in order to accomplish high-density mounting of logic chips.

In this type of conventional semiconductor device, a plurality of semiconductor integrated circuit chips each formed with a plane inductor are stacked one on another, as shown in FIGS. 1, 7, 9, and 11 of JP2005-203657A, and information is communicated among the semiconductor integrated circuit chips, making use of electromagnetic coupling among the plane inductors.

In the semiconductor device described in JP2005-203657A, a semiconductor integrated circuit chip (substrate) intervenes between two plane inductors which are involved in the communication of information. Therefore, the two plane inductors are required to have a coil area (coil diameter) proportionate to the thickness of the semiconductor integrated circuit chip (substrate) in order to electromagnetically couple the two plane inductors.

Accordingly, since a semiconductor integrated circuit chip (substrate) has a larger thickness, a plane inductor should have a larger coil area and occupy a larger proportion of a circuit integration area on the semiconductor integrated circuit chip (substrate). Consequently, the degree of freedom in designing a circuit will be limited on the semiconductor integrated circuit chip.

SUMMARY

In one embodiment, there is provided a semiconductor device that includes a pair of electromagnetically coupled inductors. Each of the inductors is comprised of a plurality of through electrodes which extend through a semiconductor substrate, and wires which connect the plurality of through electrodes in series.

The above and other objects, features, and advantages of the present invention will become apparent from the following description with reference to the accompanying drawings which illustrate an example of the present invention.

BRIEF DESCRIPTION OF THE DRAWINGS

The above feature and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

In a first embodiment of the present invention, a semiconductor device comprises a pair of electromagnetically coupled inductors, each of which is formed as a vertically wound inductor which comprises a plurality of cylindrical through electrodes extending through a semiconductor substrate, and wires which connect the plurality of through electrodes in series. The semiconductor device also comprises a rectangular parallelepiped nickel magnetic core, as a magnetic core for the pair of inductors.

Figure 1:
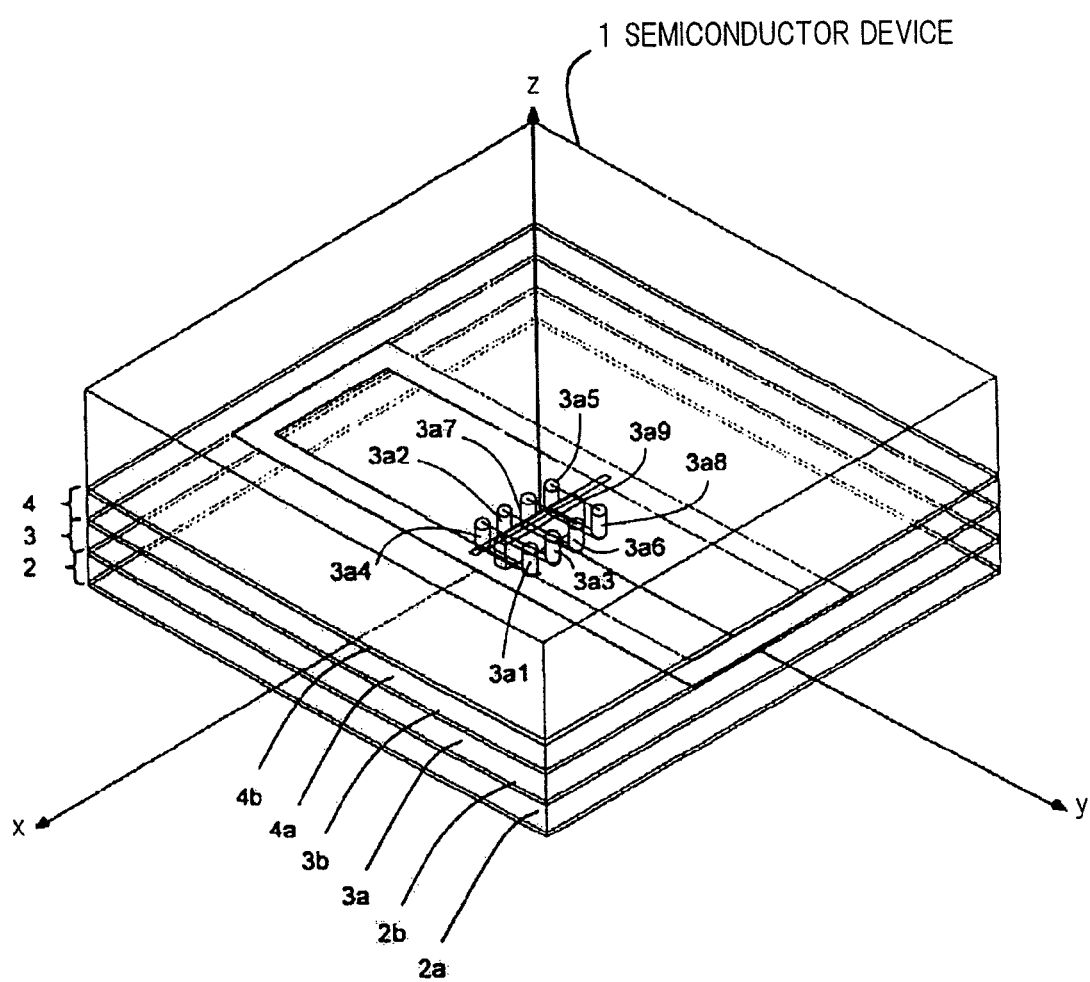
FIG. 1 is a perspective view showing a semiconductor device according to a first embodiment of the present invention.

Referring now to FIG. 1, semiconductor device 1 according to a first embodiment of the present invention includes a plurality of semiconductor integrated circuit chips (hereinafter simply referred to as the "chip") which are arranged in a stack. Here, the number of chips may be two or more. Each chip includes a semiconductor substrate (hereinafter simply referred to as the "substrate") and a wiring layer. For facilitating the understanding of the description, FIG. 1 shows chips 2-4 among a plurality of chips. Chip 2 includes substrate 2a and wiring layer 2b. Chip 3 includes substrate 3a and wiring layer 3b. Chip 4 includes substrate 4a and wiring layer 4b.

Substrate 3a is formed with cylindrical through electrodes 3a1-3a8, and rectangular parallelepiped magnetic core 3a9. The number of through electrodes is not limited to eight, but may be four or more. The shape of through electrodes 3a1-3a8 is not limited to the cylindrical shape, but may be changed as appropriate. Through electrodes 3a1-3a8 may have the same shape or differ in shape from one another. Each through electrode 3a1-3a8 is set as appropriate in terms of the size and spacing therebetween. The shape of magnetic core 3a9 is not limited to a rectangular parallelepiped shape, but may be changed as appropriate. Magnetic core 3a9 is set as appropriate in terms of the size and spacing with the through electrode.

Figure 2:
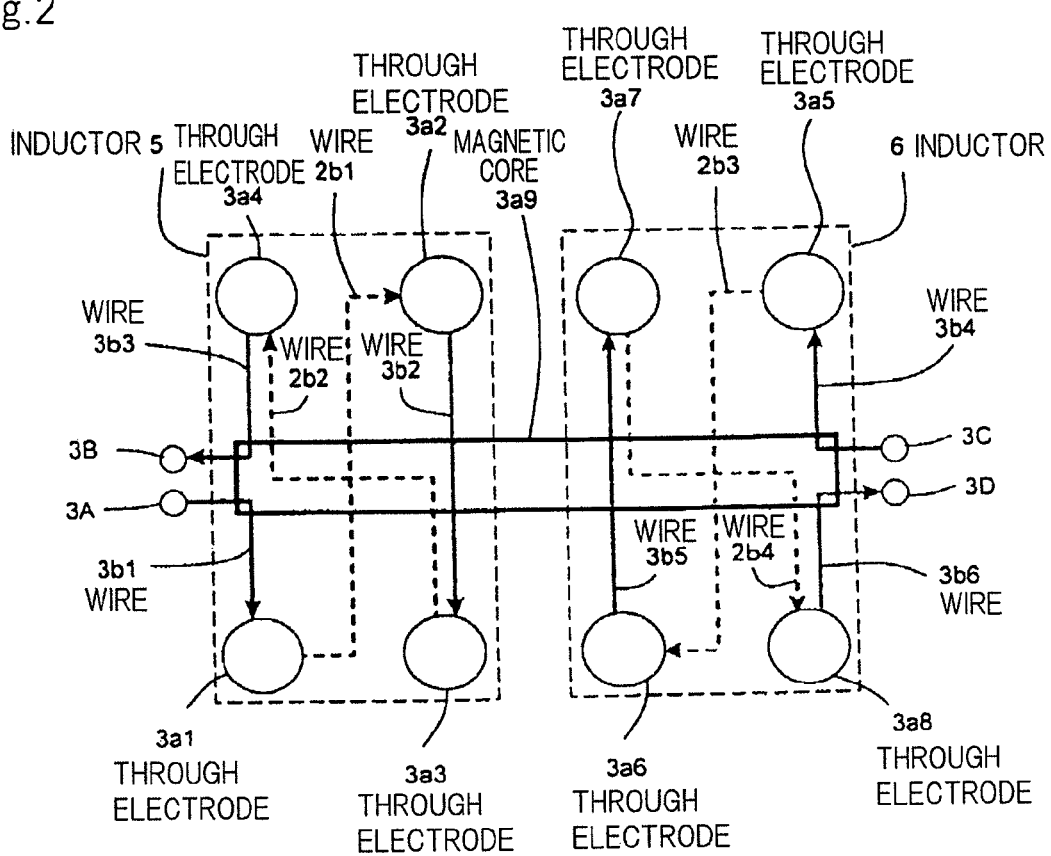
FIG. 2 is a schematic diagram showing a layout of through electrodes $3a1$-$3a8$, their form of connection, and magnetic core $3a9$.

FIG. 2 is a schematic diagram showing a layout of through electrodes 3a1-3a8, their form of connection, and magnetic core 3a9.

In FIG. 2, one of the ends of through electrode 3a1 proximate to wiring layer 3b is connected to terminal 3A by way of wire 3b1 provided on wiring layer 3b. One of the ends of through electrodes 3a1 proximate to wiring layer 2b is connected to one of the ends of through electrode 3a2 proximate to wiring layer 2b by way of wire 2b1 provided on wiring layer 2b. One of the ends of through electrode 3a2 proximate to wiring layer 3b is connected to one of the ends of through electrode 3a3 proximate to wiring layer 3b by way of wire 3b2 provided on wiring layer 3b. One of the ends of through electrode 3a3 proximate to wiring layer 2b is connected to one of the ends of through electrode 3a-4 proximate to wiring layer 2b by way of wire 2b2 drawn on wiring layer 2b. One of the ends of through electrode 3a-4 proximate to wiring layer 3b is connected to terminal 3B by way of wire 3b3 provided on wiring layer 3b.

Therefore, through electrodes 3a1-3a-4 are connected in series by way of wires 2b1-2b2 and 3b1-3b3. Consequently, inductor 5 is comprised of through electrodes 3a1-3a-4 and wires 2b1-2b2 and 3b1-3b3. Terminals 3A and 3B are connected to a transmission/reception unit (not shown) associated with inductor 5.

Also, one of the ends of through electrode 3a5 proximate to wiring layer 3b is connected to terminal 3C by way of wire 3b4 provided on wiring layer 3b. One of the ends of through electrode 3a5 proximate to wiring layer 2b is connected to one of the ends of through electrode 3a6 proximate to wiring layer 2b by way of wire 2b3 provided on wiring layer 2b. One of the ends of through electrode 3a6 proximate to wiring layer 3b is connected to one of the ends of through electrode 3a7 proximate to wiring layer 3b by way of wire 3b5 provided on wiring layer 3b. One of the ends of through electrode 3a7 proximate to wiring layer 2b is connected to one of the ends of through electrode 3a8 proximate to wiring layer 2b by way of wire 2b4 provided on wiring layer 2b. One of the ends of through electrode 3a8 proximate to wiring layer 3b is connected to terminal 3D by way of wire 3b6 provided on wiring layer 3b.

Therefore, through electrodes 3a5-3a8 are connected in series by way of wires 2b3-2b4 and 3b4-3b6. Consequently, inductor 6 is comprised of through electrodes 3a5-3a8 and wires 2b3-2b4 and 3b4-3b6. Terminal 3C and terminal 3D are connected to a transmission/reception unit (not shown) associated with inductor 6.

Inductors 5 and 6 are a pair of electromagnetically coupled inductors. Magnetic core 3a9 serves as a magnetic core for a pair of inductors 5 and 6.

Notably, in this embodiment, through electrodes 3a1-3a8 and magnetic core 3a9 are formed of the same magnetic material (for example, nickel).

As described above, semiconductor device 1 according to this embodiment includes a pair of electromagnetically coupled inductors 5 and 6. Inductor 5 is comprised of a plurality of through electrodes 3a1-3a-4 extending through substrate 3a, and wires 2b1-2b2 and 3b1-3b3 which connect the plurality of through electrodes 3a1-3a-4 in series. Inductor 6 is comprised of a plurality of through electrodes 3a5-3a8 extending through substrate 3a, and wires 2b3-2b4 and 3b4-3b6 which connect the plurality of through electrodes 3a5-3a8 in series.

Thus, part of inductors 5 and 6 can be formed in a thickness direction of substrate 3a. Consequently, the pair of electromagnetically coupled inductors can be prevented from being spaced apart from each other by at least the thickness of the substrate. The inductors are therefore not required to occupy a larger proportion of a circuit integration area on the substrate since the substrate has a larger thickness, making it possible to improve the degree of design freedom in designing circuits on a semiconductor device. Then, information can be communicated making use of electromagnetic coupling of a pair of inductors 5 and 6.

In this embodiment, semiconductor device 1 includes magnetic core 3a9 which serves as a magnetic core for the pair of inductors 5 and 6.

In this event, magnetic core 3a9 can act to increase the self inductance of each of the pair of inductors 5 and 6, and also increase a coupling coefficient for the pair of inductors 5 and 6. It is therefore possible to communicate information with high accuracy making use of the electromagnetic coupling of the pair of inductors 5 and 6.

Also, in this embodiment, through electrodes 3a1-3a8 and magnetic core 3a9 are formed of the same magnetic material (for example, nickel). By using this design, semiconductor device 1 can be made of a reduced number of materials.

Figure 3:
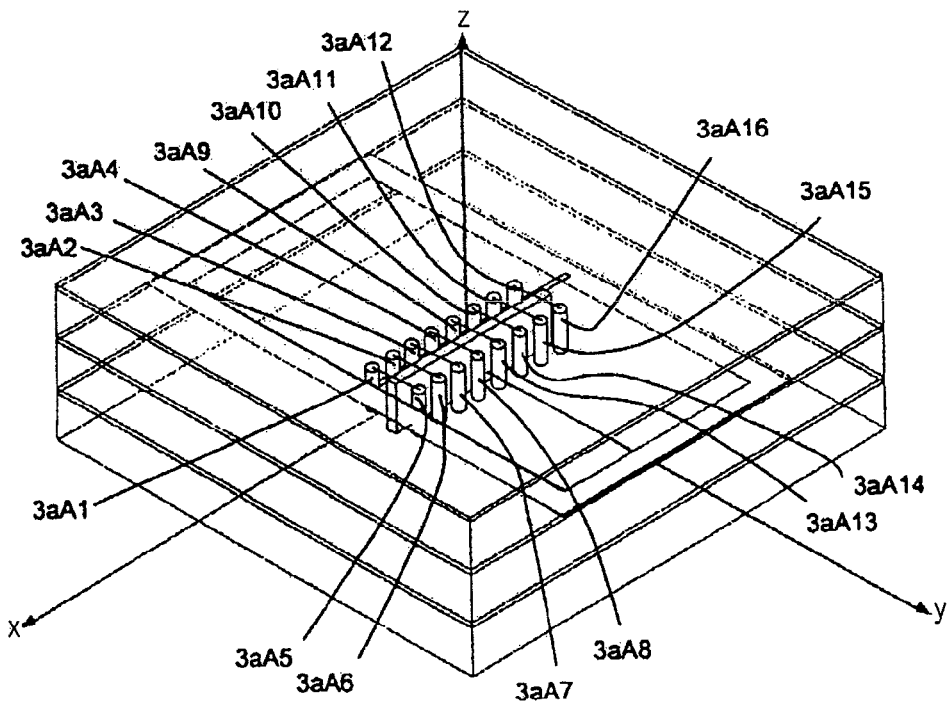
FIG. 3 is a perspective view showing another example of a pair of inductors.

While the number of windings is chosen to be two for inductors 5 and 6 in FIGS. 1 and 2, the number of windings for inductors 5 and 6 is not limited to two, but can be changed as appropriate. For example, inductors 5 and 6 may have four windings as shown in FIG. 3. In this event, through electrodes 3aA1-3aA8 connected in series by way of wires are included in inductor 5, whereas through electrodes 3aA9-3aA16 connected in series by way of wires are included in inductor 6.

Second Embodiment

Semiconductor device 1A according to a second embodiment of the present invention differs from semiconductor device 1 according to the first embodiment in that each of paired inductors formed of through electrodes 3a1-3a8 is a multi-layer coil which includes an inner coil and an outer coil. In the following, semiconductor device 1A according to the second embodiment will be described with a focus placed on aspects that are different from semiconductor device 1 according to the first embodiment.

Figure 4:
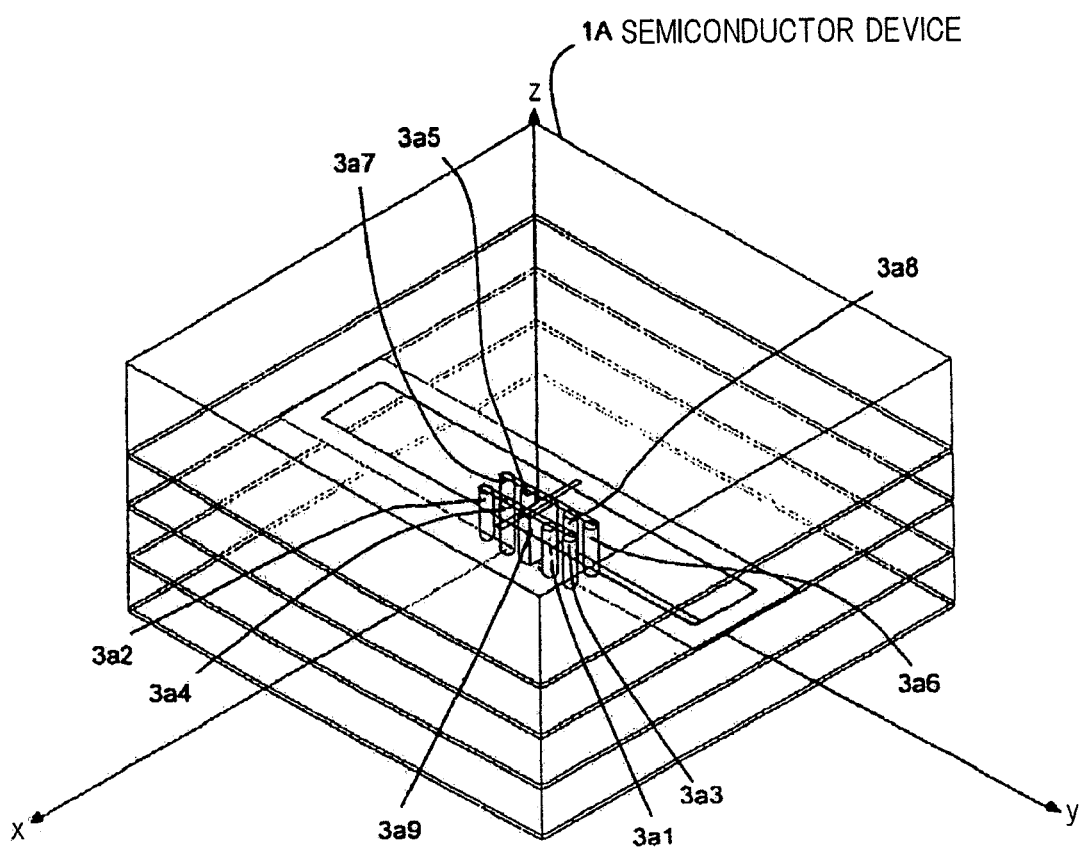
FIG. 4 is a perspective view showing semiconductor device 1A according to a second embodiment of the present invention.
Figure 5:
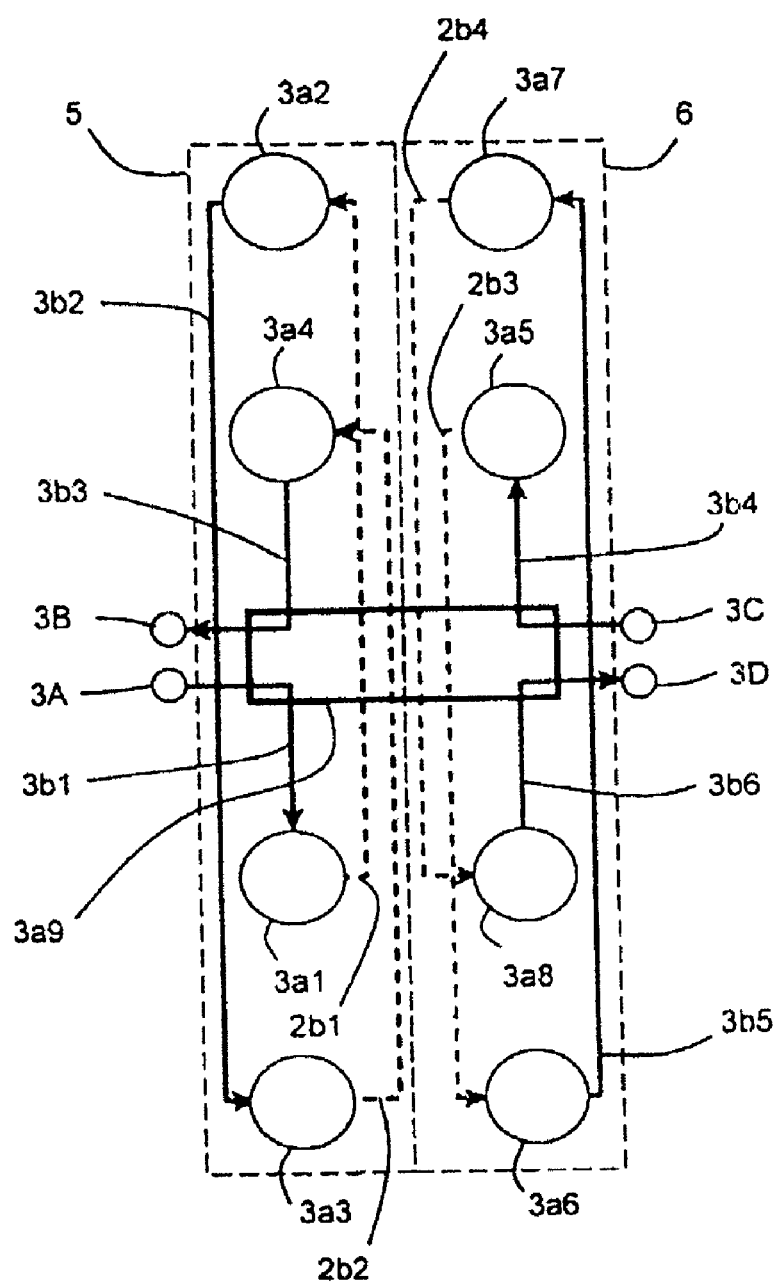
FIG. 5 is a schematic diagram showing a layout of through electrodes $3a1$-$3a8$, their form of connection, and magnetic core $3a9$.

FIG. 4 is a perspective view showing semiconductor device 1A according to the second embodiment. In FIG. 4, the same components as those shown in FIG. 1 are designated the same reference numerals. FIG. 5 is a schematic diagram showing a layout of through electrodes 3a1-3a8, their form of connection, and magnetic core 3a9. In FIG. 5, the same components as those shown in FIG. 2 are designated the same reference numerals.

As shown in FIGS. 4 and 5, through electrodes 3a1-3a-4 are arranged in a line, and through electrodes 3a5-3a8 are also arranged in a line. As such, each of inductors 5 and 6 is a multi-layer coil which includes an inner coil and an outer coil. Thus, semiconductor device 1A according to the second embodiment can reduce the length of magnetic core 3a9, as compared with semiconductor device 1 according to the first embodiment.

Third Embodiment

Semiconductor device 1B according to a third embodiment of the present invention differs from semiconductor device 1A according to the second embodiment in that at least part of one of paired inductors 5 and 6 formed of through electrodes 3a1-3a8 is disposed within the circumference of the other inductor. In the following, semiconductor device 1B according to the third embodiment will be described with a focus placed on aspects that are different from semiconductor device 1A according to the second embodiment.

Figure 6:
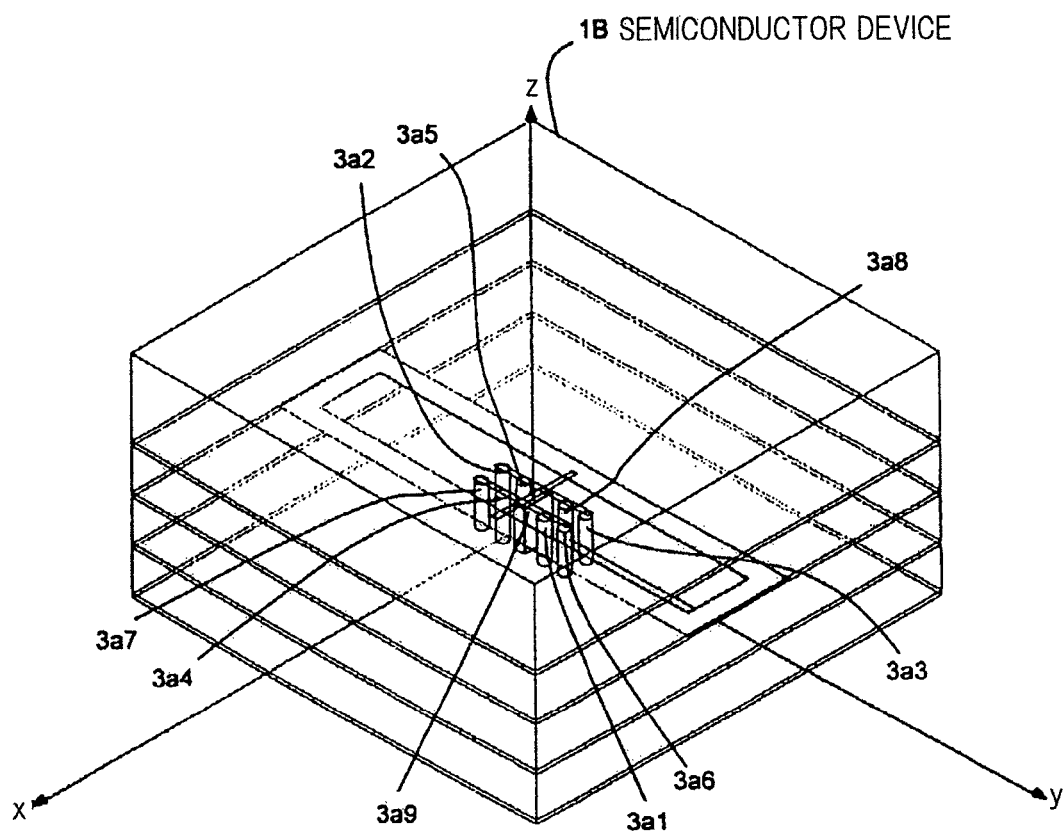
FIG. 6 is a perspective view showing semiconductor device 1B according to a third embodiment of the present invention.
Figure 7:
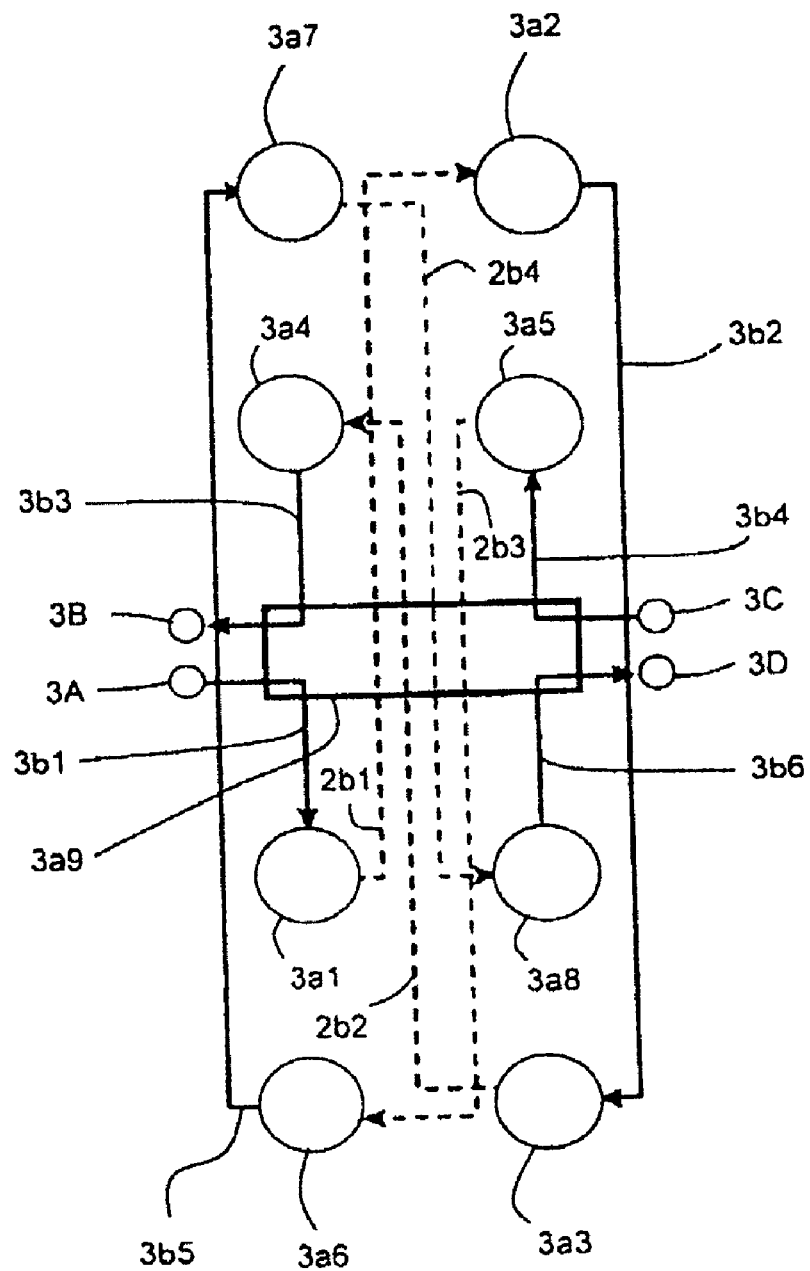
FIG. 7 is a schematic diagram showing a layout of through electrodes $3a1$-$3a8$, their form of connection, and magnetic core $3a9$.

FIG. 6 is a perspective view showing semiconductor device 1B according to the third embodiment. In FIG. 6, the same components as those shown in FIG. 4 are designated the same reference numerals. FIG. 7 is a schematic diagram showing a layout of through electrodes 3a1-3a8, their form of connection, and magnetic core 3a9. In FIG. 7, the same components as those shown in FIG. 5 are designated the same reference numerals.

As shown in FIGS. 6 and 7, at least part of one of the pared inductors 5 and 6 is disposed within the circumference formed by the other inductor. Accordingly, inductors 5 and 6 are in closer proximity to each other. It is therefore possible to increase a coupling coefficient of the pair of inductors 5 and 6. Consequently, information can be communicated with high accuracy, making use of the electromagnetic coupling of the pair of inductors 5 and 6.

Figure 8:
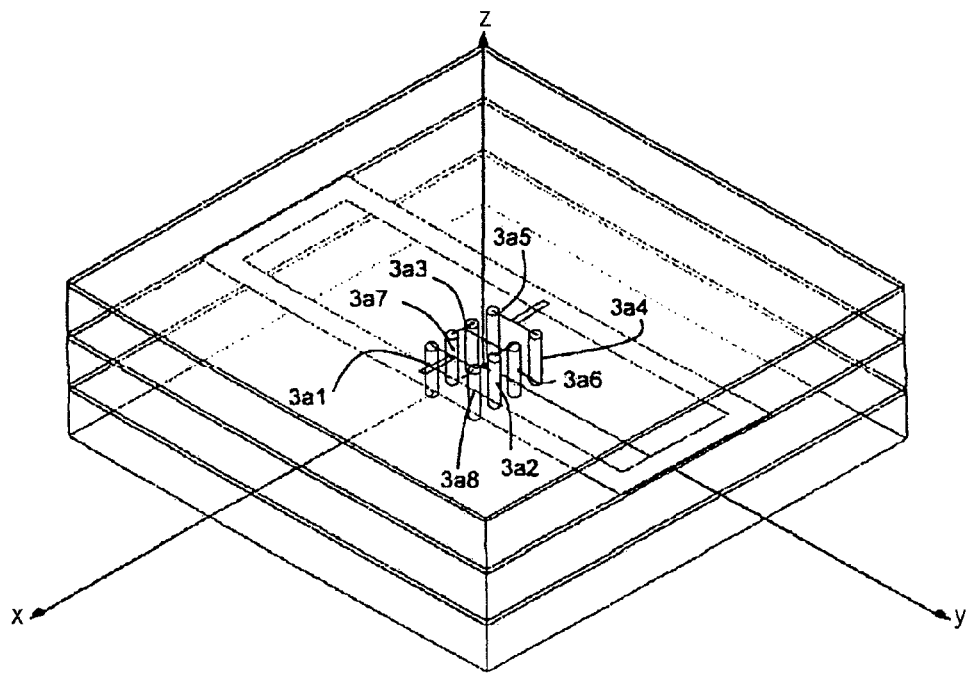
FIG. 8 is a perspective view showing another example of the third embodiment.
Figure 9:
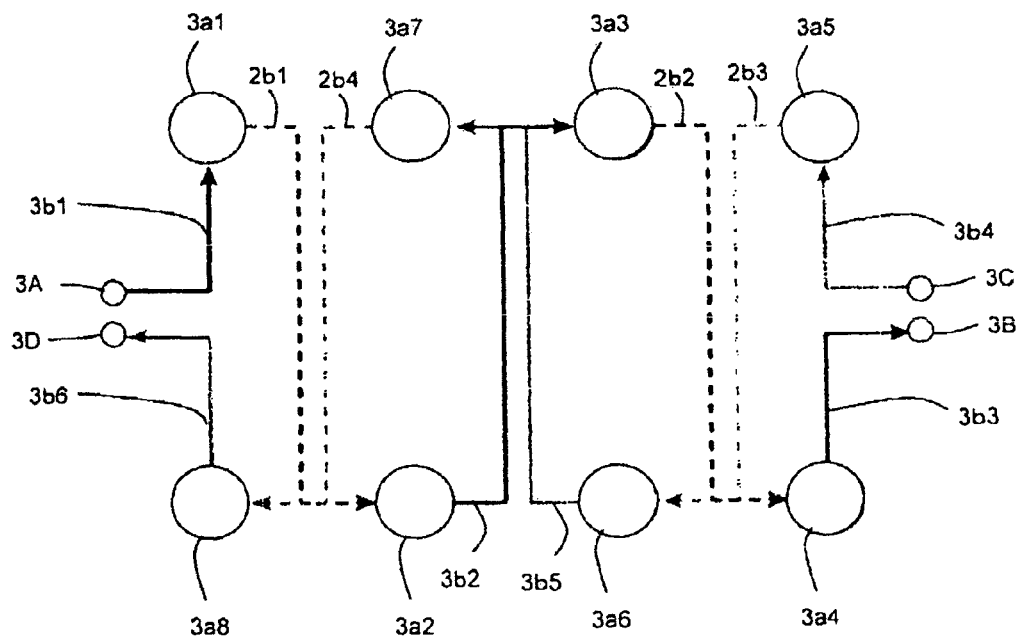
FIG. 9 is a schematic diagram showing a layout of through electrodes $3a1$-$3a8$, their form of connection, and magnetic core $3a9$.

While FIGS. 6 and 7 show an exemplary semiconductor device which includes inductors 5 and 6, each of which is a multi-layer coil, where at least part of one inductor is disposed within the circumference formed by the other inductor, each of inductors 5 and 6 may not be the multi-layer coil, as shown in FIGS. 8 and 9.

FIG. 8 is a perspective view showing a semiconductor device which comprises inductors 5 and 6, each of which is not a multi-layer coil (i.e., a single layer coil), where at least part of one inductor is disposed within the circumference formed by the other inductor. In FIG. 8 the same components as those shown in FIG. 1 are designated the same reference numerals. FIG. 9 is a schematic diagram showing a layout of through electrodes 3a1-3a8, their form of connection, and magnetic core 3a9 within the semiconductor device shown in FIG. 8. In FIG. 9, the same components as those shown in FIG. 2 are designated the same reference numerals.

Fourth Embodiment

Semiconductor device 1C according to a fourth embodiment of the present invention differs from semiconductor device 1 according to the first embodiment in that inductors 5 and 6 are oriented in directions that are different by 90 degrees, and magnetic core 3a9 is bent at an angle of 90 degrees in conformity to the orientations. In the following, semiconductor device 1C according to the fourth embodiment will be described with a focus placed on aspects that are different from semiconductor device 1 according to the first embodiment.

Figure 10:
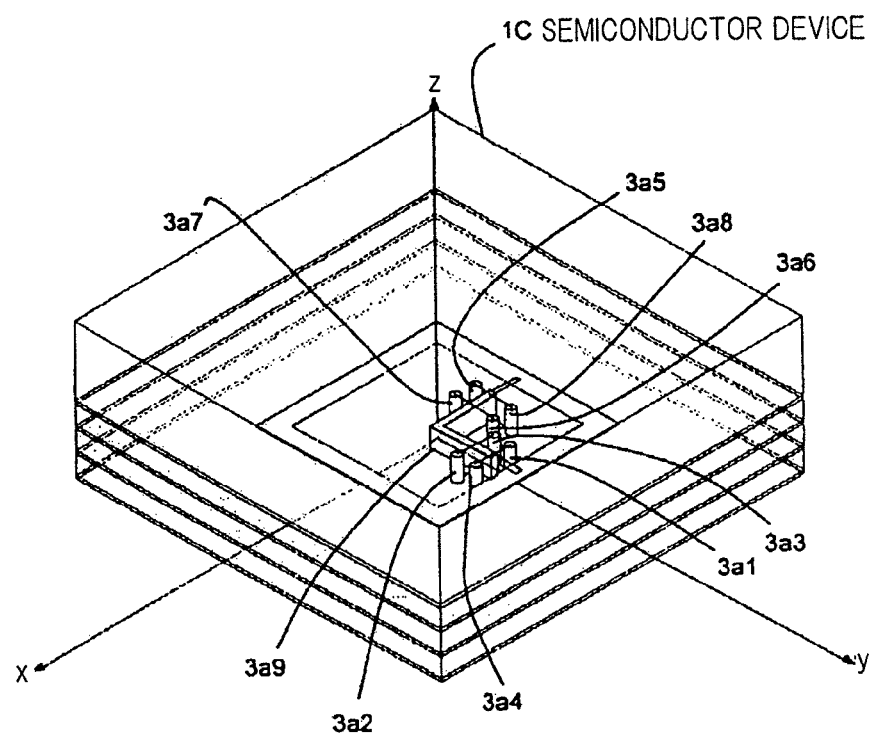
FIG. 10 is a perspective view showing semiconductor device 1C according to a fourth embodiment of the present invention.

FIG. 10 is a perspective view showing semiconductor device 1C according to the fourth embodiment. In FIG. 10, the same components as those shown in FIG. 1 are designated the same reference numerals.

Notably, the angle formed by the orientations of inductors 5 and 6, and the angle by which magnetic core 3a9 is bent are not limited to 90 degrees, but can be changed as appropriate. In addition, inductors 5 and 6 are not limited to those shown in the first embodiment, but may be those shown in the second or third embodiment.

The fourth embodiment can provide similar benefits to the first embodiment, and can additionally reduce restraints in positional relationship between inductors 5 and 6.

Fifth Embodiment

Semiconductor device 1D according to a fifth embodiment of the present invention differs from semiconductor device 1 according to the first embodiment in that magnetic core 3a9 is comprised of a plurality of partial magnetic core segments 3a91-3a94. In the following, semiconductor device 1D according to the fifth embodiment will be described with a focus placed on aspects that are different from semiconductor device 1 according to the first embodiment.

Figure 11:
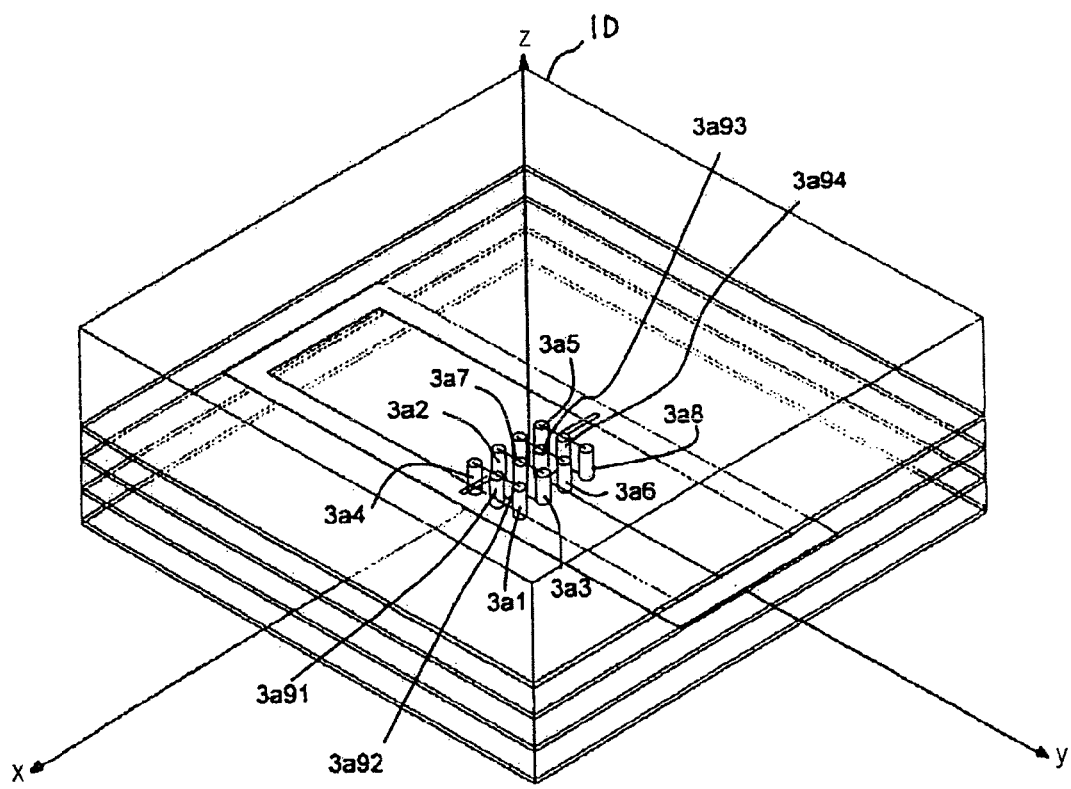
FIG. 11 is a perspective view showing semiconductor device 1D according to a firth embodiment of the present invention.
Figure 12:
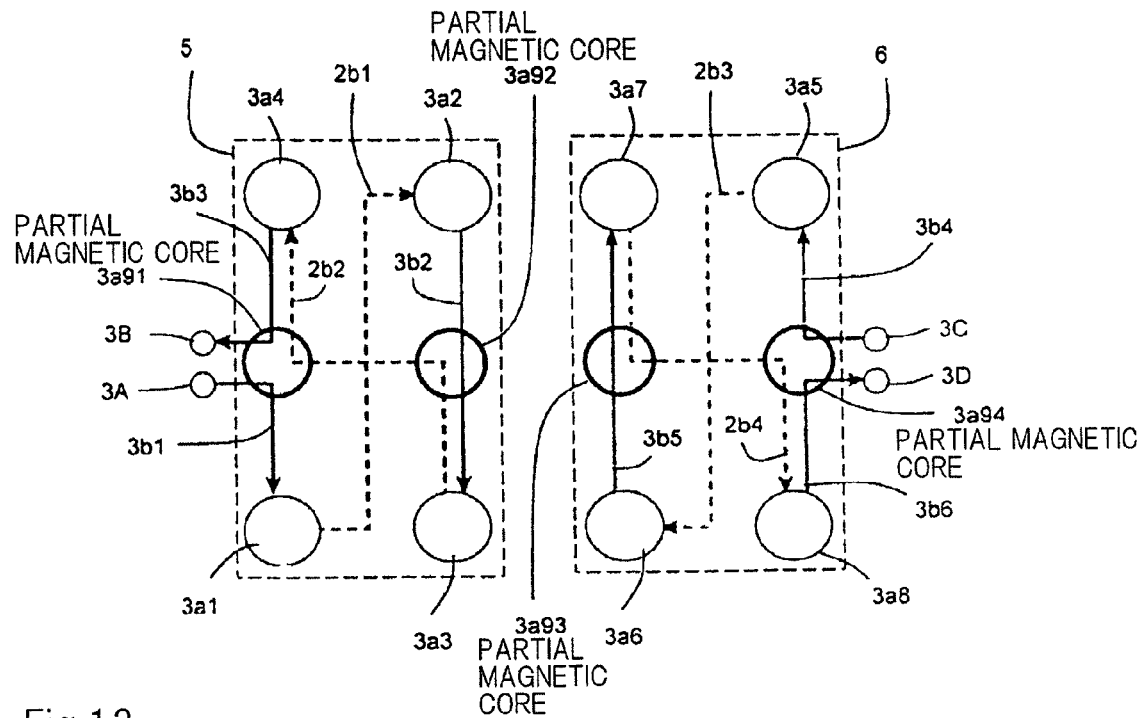
FIG. 12 is a schematic diagram showing a layout of through electrodes $3a1$-$3a8$, their form of connection, and magnetic core $3a9$.

FIG. 11 is a perspective view showing semiconductor device 1D according to the fifth embodiment. In FIG. 11, the same components as those shown in FIG. 1 are designated the same reference numerals. FIG. 12 is a schematic diagram showing a layout of through electrodes 3a1-3a8, their form of connection, and magnetic core 3a9. In FIG. 12, the same components as those shown in FIG. 2 are designated the same reference numerals.

Inductors 5 and 6 are not limited to those shown in the first embodiment, but may be those shown in the second, third, or fourth embodiment. Notably, when inductors 5 and 6 employed herein are those shown in the fourth embodiment, the magnetic core shown in the fourth embodiment is used as magnetic core 3a9.

As shown in FIGS. 11 and 12, magnetic core 3a9 is comprised of a plurality of cylindrical partial magnetic core segments 3a91-3a94. Partial magnetic core segments 3a91-3a94 may not be in a cylindrical shape, or may not be in the same shape. Also, the number of partial magnetic core segments is not limited to four, but can be changed as appropriate.

For example, by individually fixing the potentials of partial magnetic core segments 3a91-3a94, the effect of magnetic core 3a9 can be made variable, resulting in the formation of a tank circuit which is free from movable components and which supports a plurality of frequencies. It is therefore possible to form an ultra-high speed RF system which comprises a three-dimensional chip laminate structure.

Sixth Embodiment

Semiconductor device 1E according to a sixth embodiment of the present invention differs from semiconductor device 1 according to the first embodiment in that a magnetic element is arranged around a pair of inductors 5 and 6. In the following, semiconductor device 1E according to the sixth embodiment will be described with focus placed on aspects that are different from semiconductor device 1 according to the first embodiment.

Figure 13:
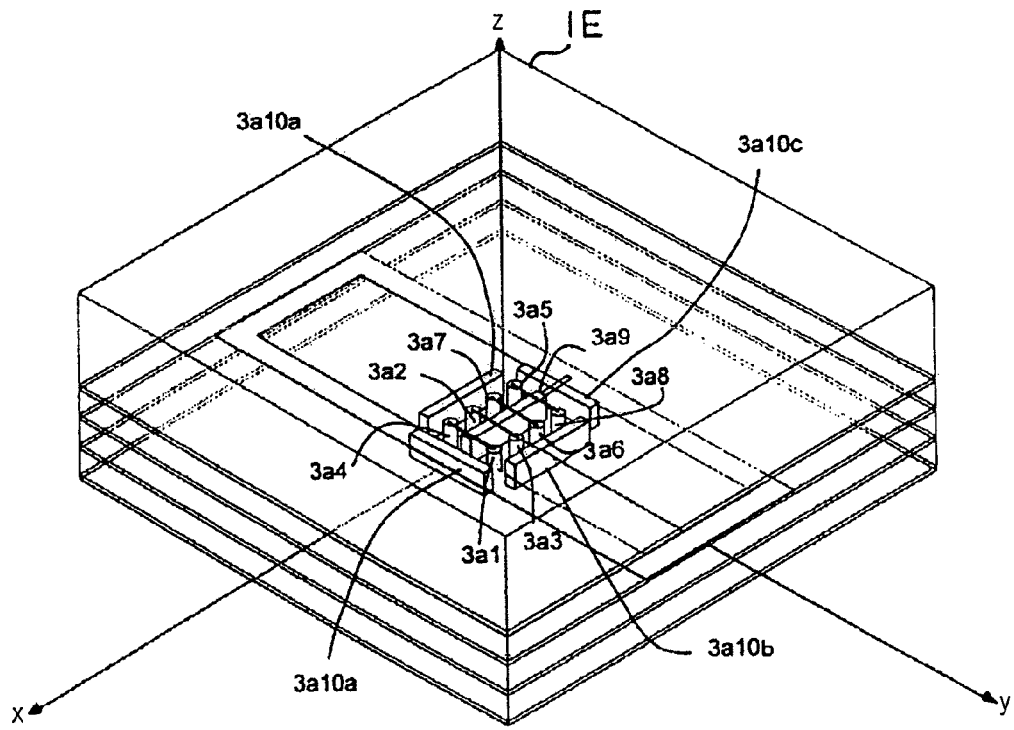
FIG. 13 is a perspective view showing semiconductor device 1E according to a sixth embodiment of the present invention.
Figure 14:
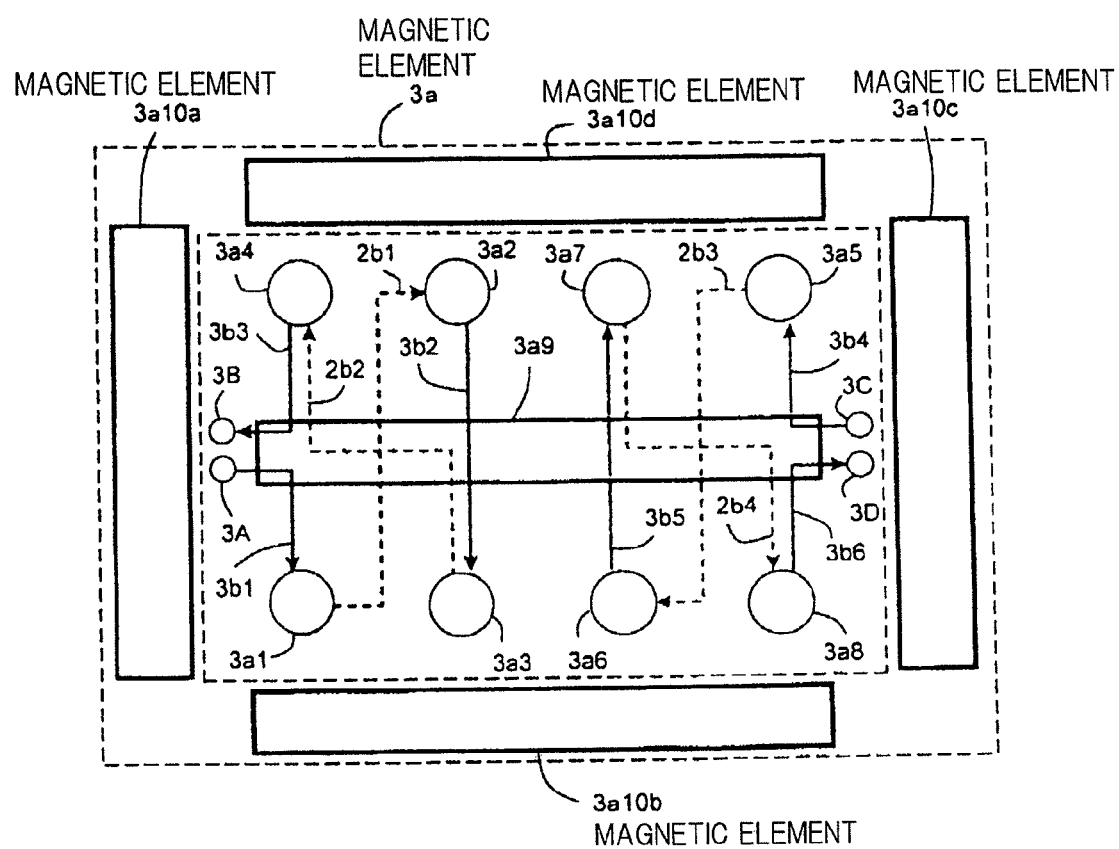
FIG. 14 is a schematic diagram showing a layout of through electrodes $3a1$-$3a8$, their form of connection, magnetic core $3a9$, and magnetic element $3a10$.

FIG. 13 is a perspective view showing semiconductor device 1E according to the sixth embodiment. In FIG. 13, the same components as those shown in FIG. 1 are designated the same reference numerals. FIG. 14 is a schematic diagram showing a layout of through electrodes 3a1-3a8, their form of connection, and magnetic core 3a9, and magnetic element 3a10. In FIG. 14, the same components as those shown in FIG. 2 or 13 are designated the same reference numerals.

Inductors 5 and 6 are not limited to those shown in the first embodiment, but may be those shown in the second, third, or fourth embodiment. Notably, when inductors 5 and 6 employed herein are those shown in the fourth embodiment, the magnetic core shown in the fourth embodiment is used as magnetic core 3a9.

Magnetic core 3a9, in turn, is not limited to that shown in the first embodiment, but the magnetic core shown in the fifth embodiment may be employed instead.

As shown in FIGS. 13 and 14, magnetic element 3a10 including magnetic element segments 3a10a-3a10d are arranged around a pair of inductors 5 and 6. In this embodiment, magnetic core 3a9, through electrodes 3a1-3a8, and magnetic element 3a10 are formed of the same magnetic material (for example, nickel). Magnetic element 3a10 is not limited to that comprised of four magnetic element segments.

In the sixth embodiment, since magnetic element 3a10 is arranged around a pair of inductors 5 and 6, flux from inductors 5 and 6 passes through magnetic element 3a10. It is therefore possible to increase the inductance and coupling coefficient of the pair of inductors 5 and 6.

Seventh Embodiment

Semiconductor device 1F according to a seventh embodiment of the present invention differs from semiconductor device 1E according to the sixth embodiment in that integral magnetic element 3a10 is employed, and magnetic element 3a10 is connected to magnetic core 3a9. In the following, semiconductor device 1F according to the seventh embodiment will be described with focus placed on aspects that are different from semiconductor device 1E according to the sixth embodiment.

Figure 15:
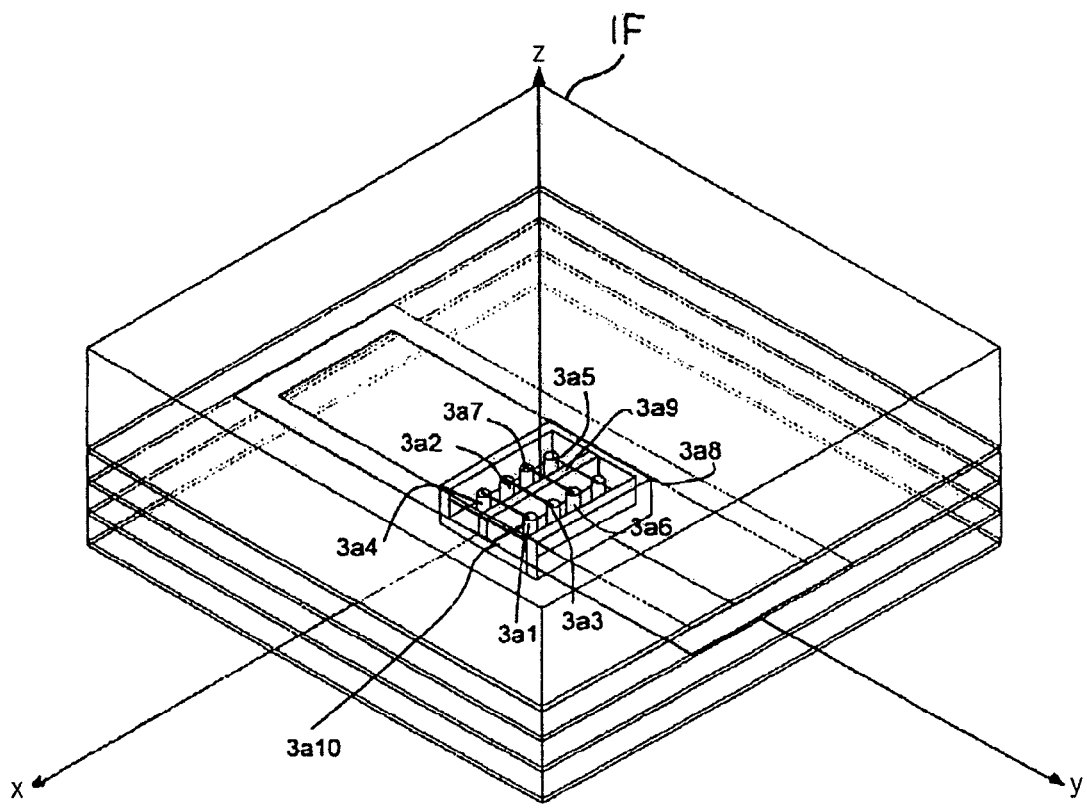
FIG. 15 is a perspective view showing semiconductor device 1F according to a seventh embodiment of the present invention.
Figure 16:
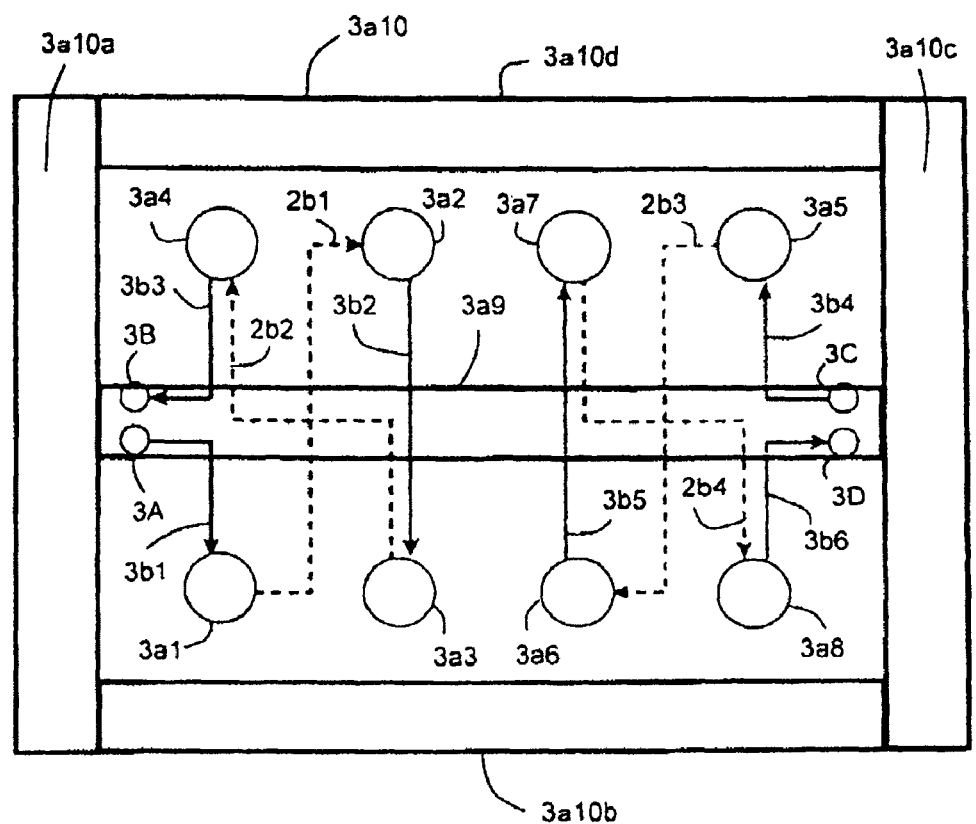
FIG. 16 is a schematic diagram showing a layout of through electrodes $3a1$-$3a8$, their form of connection, magnetic core $3a9$, and magnetic element $3a10$.

FIG. 15 is a perspective view showing semiconductor device 1F according to the seventh embodiment. In FIG. 15 components having the same function as those shown in FIG. 13 are designated the same reference numerals. FIG. 16 is a schematic diagram showing a layout of through electrodes 3a1-3a8, their form of connection, and magnetic core 3a9, and magnetic element 3a10. In FIG. 16, components having the same functions as those shown in FIG. 14 are designated the same reference numerals.

Inductors 5 and 6 are not limited to those shown in the first embodiment, but may be those shown in the second, third, or fourth embodiment. Notably, when inductors 5 and 6 employed herein are those shown in the fourth embodiment, the magnetic core shown in the fourth embodiment is used as magnetic core 3a9.

As shown in FIGS. 15 and 16, integral magnetic element 3a10 is employed, and magnetic element 3a10 is connected to magnetic core 3a9. This facilitates flux from inductors 5 and 6 to pass through magnetic element 3a10 and magnetic core 3a9. It is therefore possible to increase the inductance and coupling coefficient of the pair of inductors 5 and 6.

Eighth Embodiment

A semiconductor device according to an eighth embodiment of the present invention differs from the other embodiments in that the former includes a plurality of magnetic cores 3a9. In the following, the semiconductor device according to the eighth embodiment will be described with a focus placed on aspects that are different from the semiconductor devices according to the other embodiments.

Figure 17A:
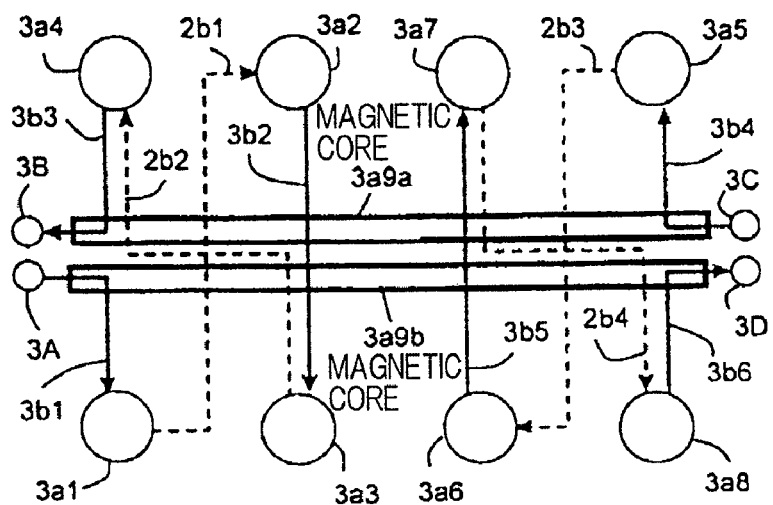
FIG. 17A is a schematic diagram showing a main portion of a semiconductor device according to an eighth embodiment of the present invention.
Figure 17B:
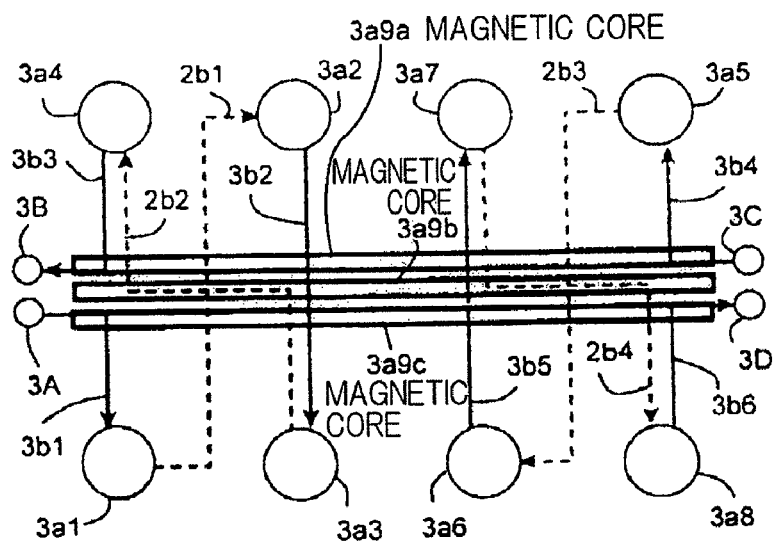
FIG. 17B is a schematic diagram showing a main portion of the semiconductor device according to the eighth embodiment of the present invention.

FIG. 17A is a schematic diagram showing an example which uses two magnetic cores 3a9a and 3a9b in each of the foregoing embodiments. FIG. 17B is a schematic diagram showing an example which uses three magnetic cores 3a9a, 3a9b, and 3a9c in each of the foregoing embodiments.

The use of a plurality of magnetic cores can mutually restrict eddy currents generated in the respective magnetic cores. Accordingly, when there is a reduction in eddy currents, high inductances and high coupling coefficient can be accomplished even in high frequency bands.

Ninth Embodiment

Semiconductor device 1G according to a ninth embodiment of the present invention includes a pair of inductors, each of which is formed as a horizontally wound inductor. Also, semiconductor device 1G according to the ninth embodiment does not comprise a magnetic core.

Figure 18:
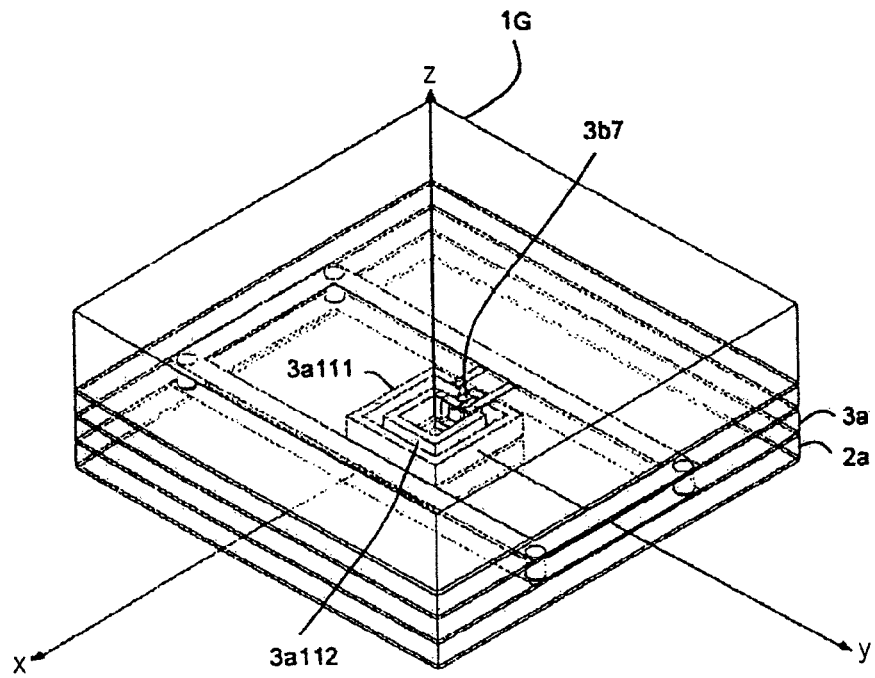
FIG. 18 is a perspective view showing semiconductor device 1G according to a ninth embodiment of the present invention.

FIG. 18 is a perspective view showing semiconductor device 1G according to the ninth embodiment. In FIG. 18, coil-shaped through electrodes 3a111 and 3a112 are connected in series by way of wire 3b7 on substrate 3a to construct inductor 5. Also, two coil-shaped through electrodes are connected in series through a wire on substrate 2a to construct inductor 6. Inductors 5 and 6 are a pair of electromagnetically coupled inductors.

Semiconductor device 1G according to the ninth embodiment can employ horizontally wound inductors for a pair of inductors.

Tenth Embodiment

In semiconductor device 1H according to a tenth embodiment of the present invention, a pair of horizontally wound inductors are formed on the same substrate. In addition, semiconductor device 1H according to the tenth embodiment does not comprise a magnetic core.

Figure 19:
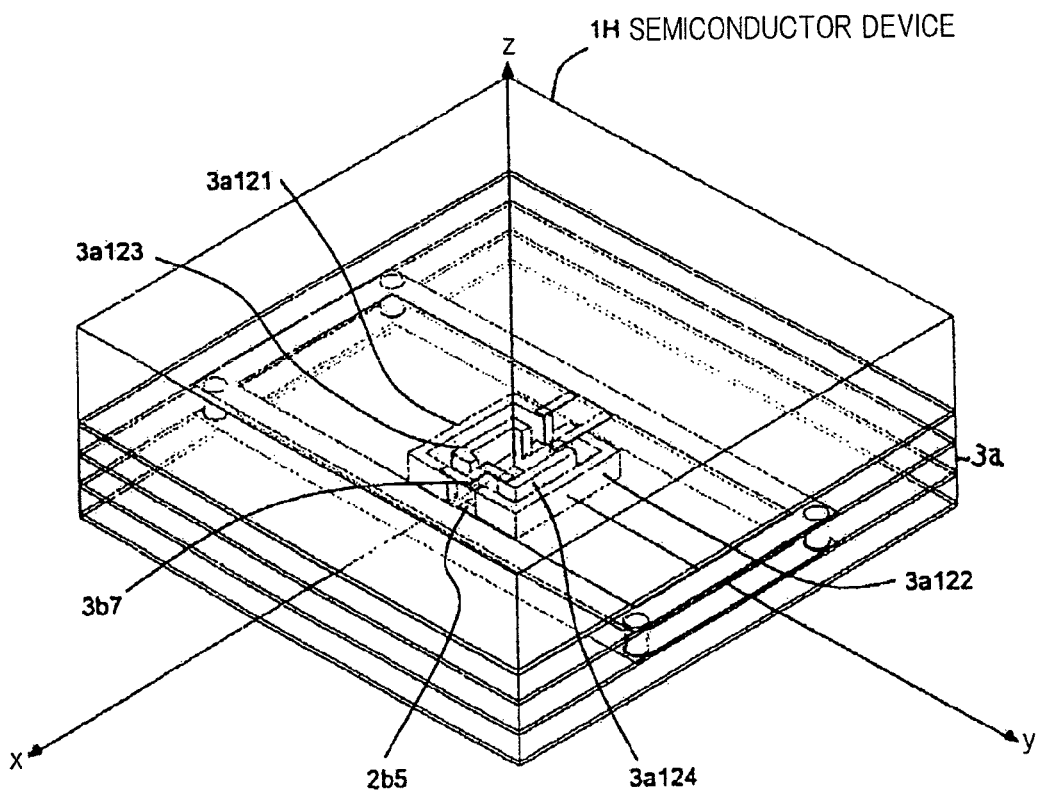
FIG. 19 is a perspective view showing semiconductor device 1H according to a tenth embodiment of the present invention.
Figure 20:
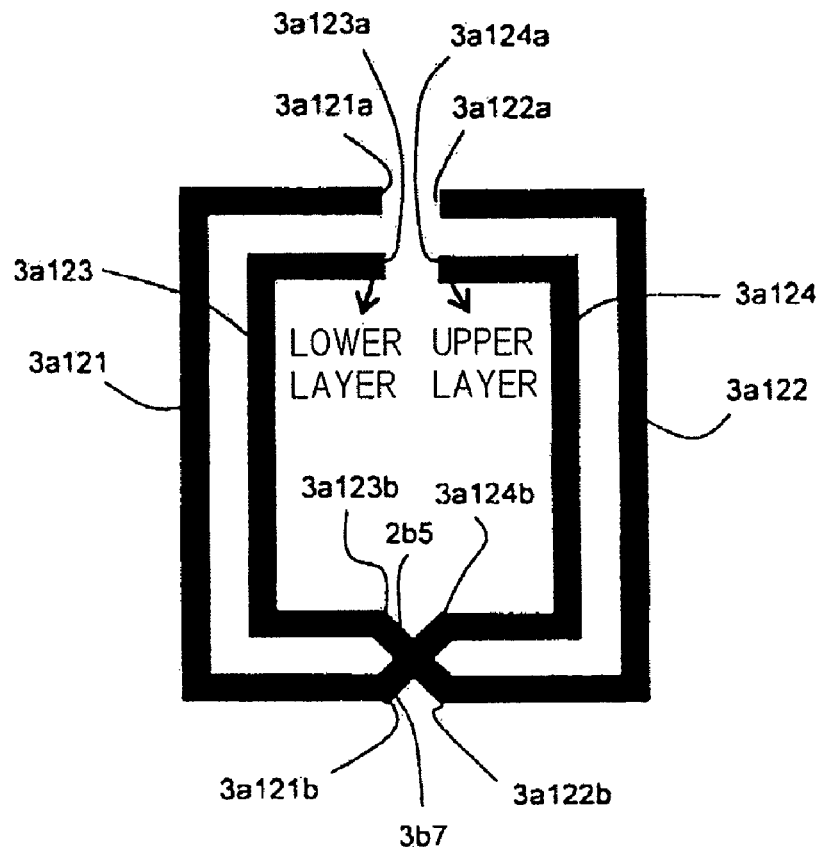
FIG. 20 is a schematic diagram showing an inductor included in semiconductor device 1H.

FIG. 19 is a perspective view showing semiconductor device 1H according to the tenth embodiment. FIG. 20 is a schematic diagram showing inductors included in semiconductor device 1H.

As shown in FIGS. 19 and 20, through electrodes 3a121-3a124 formed on substrate 3a are in an inverted C shape. Ends 3a121a and 3a121b of through electrode 3a121 are respectively disposed to oppose ends 3a122a and 3a122b of through electrode 3a122 with a predefined spacing interposed therebetween. Ends 3a123a and 3a123b of through electrode 3a123 are respectively disposed to oppose ends 3a124a and 3a124b of through electrode 3a124 with a predefined spacing interposed therebetween.

End 3a121b and end 3a124b are connected in series by way of wire 3b7 to complete inductor 5. Also, end 3a122b and end 3a123b are connected in series by way of wire 2b5 to complete inductor 6. Inductors 5 and 6 are a pair of electromagnetically coupled inductors.

In semiconductor device 1H according to the tenth embodiment, a pair of horizontally wound inductors are formed on the same substrate. It is therefore possible to form a pair of horizontally wound inductors with a smaller number of substrates.

Eleventh Embodiment

Semiconductor device 1I according to an eleventh embodiment of the present invention comprises through wires and inductors between stacked chips.

Figure 21:
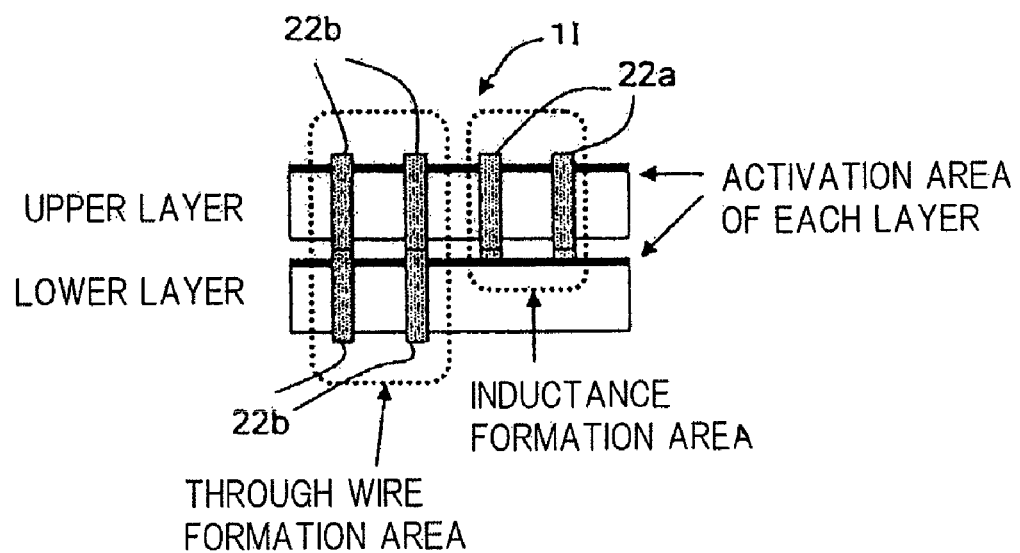
FIG. 21 is a cross-sectional view showing semiconductor device 1I according to an eleventh embodiment of the present invention.
Figure 22:
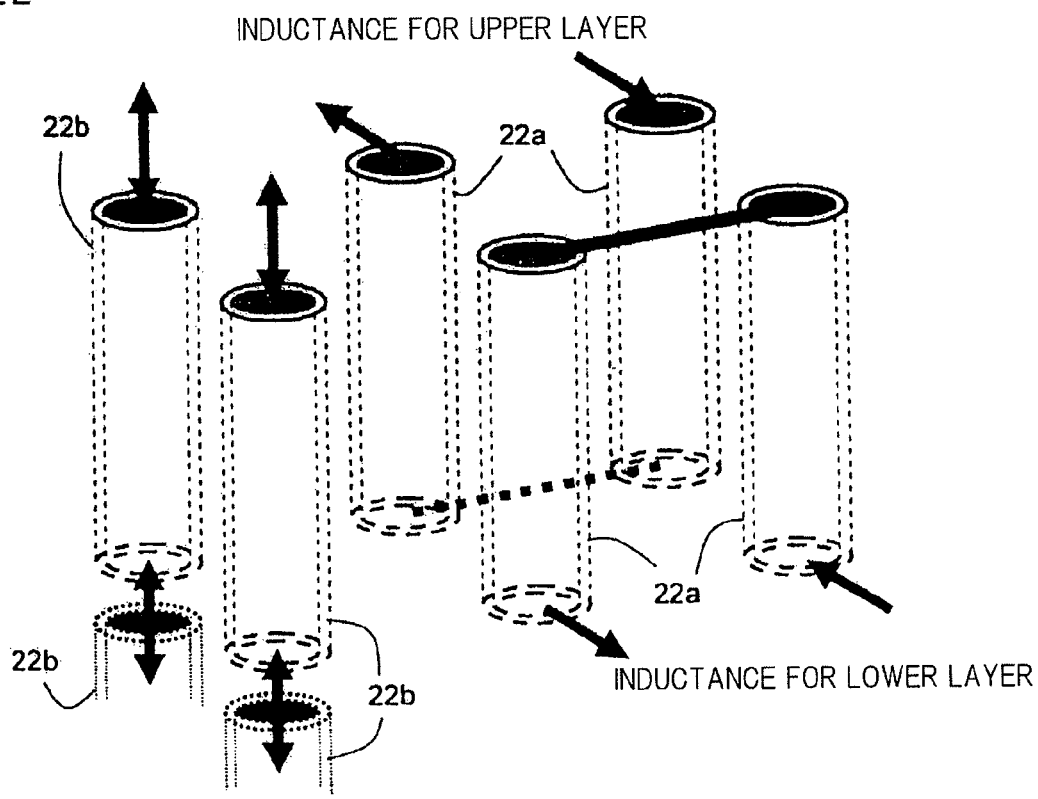
FIG. 22 is a schematic diagram showing a through electrode for an inductor and a through electrode for a through wire.

FIG. 21 is a cross-sectional view showing semiconductor device 1I according to the eleventh embodiment. Notably, for facilitating understanding, FIG. 21 shows in exaggeration the length of through electrode 22a for use as an inductor and the length of through electrode 22b for use as a through wire. FIG. 22 is a schematic diagram showing through electrode 22a for use as an inductor and through electrode 22b for use as a through wire. In semiconductor device 1I, through electrode 22a for use as an inductor and through electrode 22b for use as a through wire are made in the same shape. As such, each through electrode is available for use as an inductor or for use as a through wire. In the following, this through electrode is referred to as the "common through electrode."

Next, a method of manufacturing a common through electrode will be described with reference to FIG. 23.

Figure 23A:
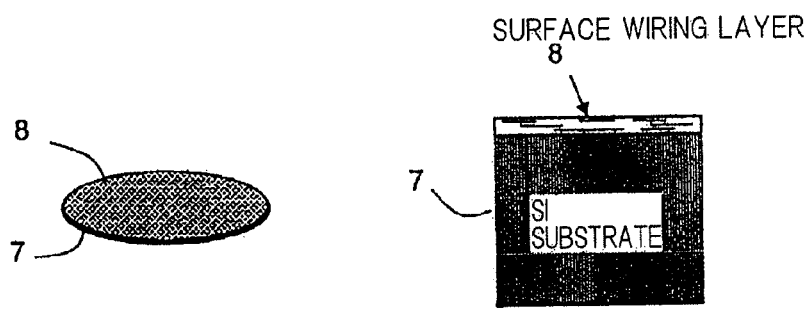
FIG. 23A is a process diagram for describing a method of manufacturing a common through electrode.

First, wiring layer (surface wiring layer) 8 is formed on one surface of Si (silicon) substrate 7 as a semiconductor substrate (see FIG. 23A).

Figure 23B:
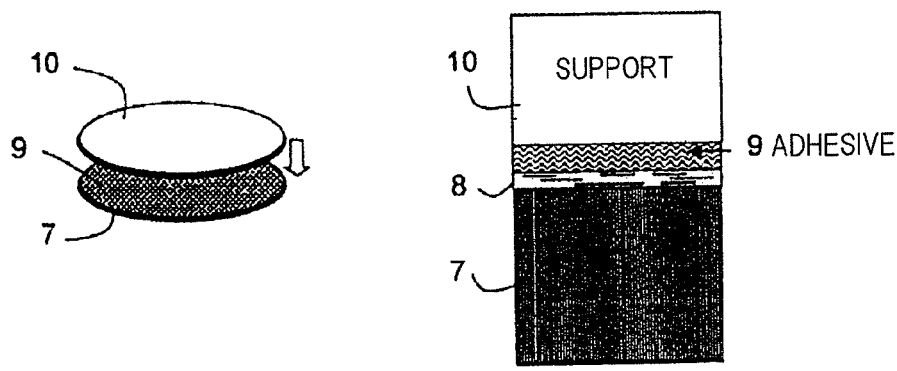
FIG. 23B is a process diagram for describing the method of manufacturing the common through electrode.

Subsequently, glass support 10 is adhered to wiring layer 8 using adhesive 9 (see FIG. 23B).

Figure 23C:
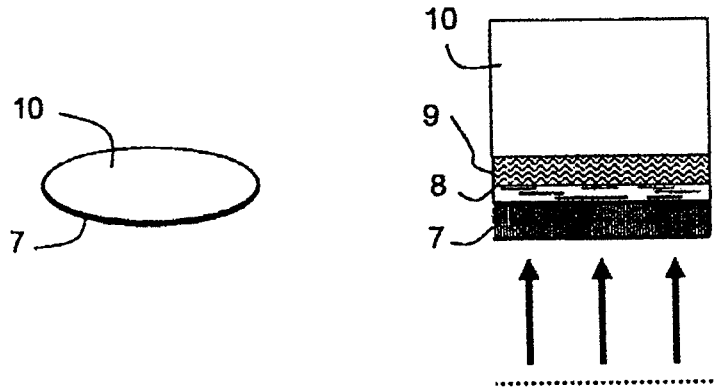
FIG. 23C is a process diagram for describing the method of manufacturing the common through electrode.

Subsequently, substrate 7 is ground from the surface on which wiring layer 8 is not formed (hereinafter referred to as "the other surface") to the surface on which wiring layer 8 is formed (see FIG. 23C).

Subsequently, a first step is performed, involving inverting substrate 7 to which glass support 10 is adhered, and etching the other surface of substrate 7 to form a plurality of through holes (throughholes for through wires and through holes for inductors) 11 which extends from the other surface to wiring layer 8 (see FIG. 23D).

Figure 23D:
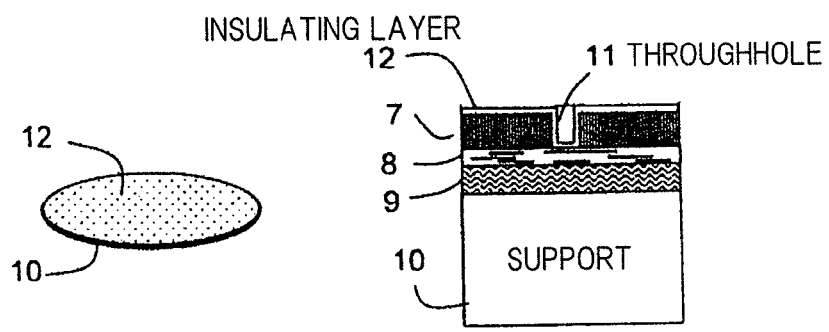
FIG. 23D is a process diagram for describing the method of manufacturing the common through electrode.

It should be noted that the cross-sectional view on the right hand side of FIG. 23D shows part of a semiconductor device on the left hand side of FIG. 23D. Thus, while only one throughhole 11 is shown in the cross-sectional view on the right hand side of FIG. 23D, a plurality of throughholes 11 are formed in the semiconductor device on the left hand side of FIG. 23D.

Subsequently, a second step is performed, involving forming insulating layer 12 on substrate 7 and each throughhole 11 by a CVD method (see FIG. 23D), and etching insulating layer 12 which remains on the bottom of each throughhole 11 to remove insulating layer 12 which remains on the bottom of each throughhole 11. Consequently, each throughhole 11 reaches wiring layer 8, and the insulating layer is formed on a side surface of each throughhole 11.

Figure 23E:
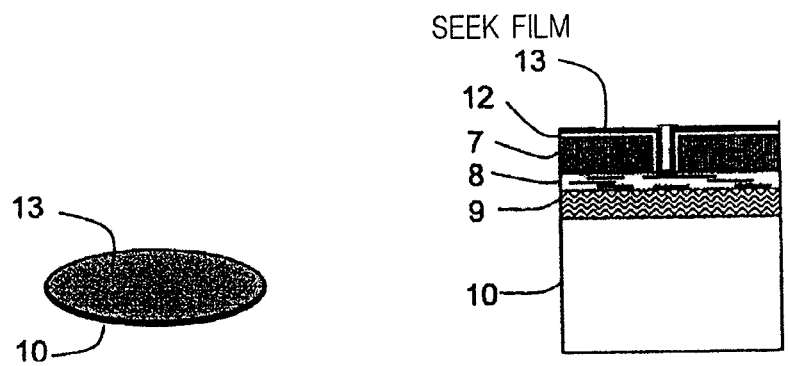
FIG. 23E is a process diagram for describing the method of manufacturing the common through electrode.
Figure 23F:
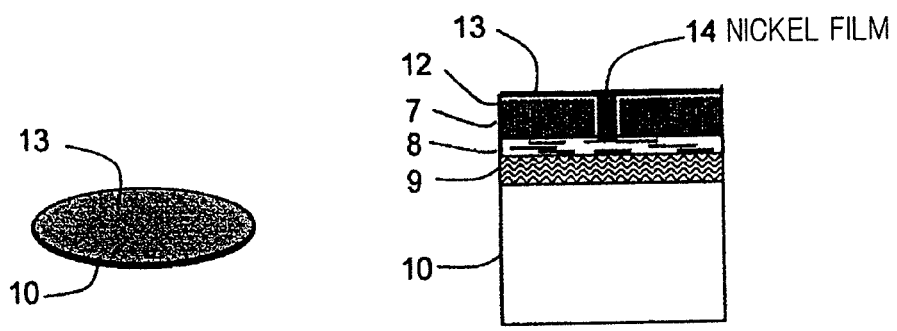
FIG. 23F is a process diagram for describing the method of manufacturing the common through electrode.
Figure 23G:
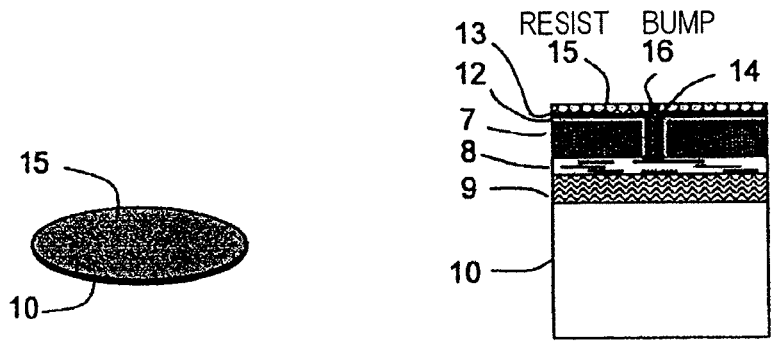
FIG. 23G is a process diagram for describing the method of manufacturing the common through electrode.

Subsequently, seed film 13 is formed on insulating layer 12 and the bottom of each throughhole 11 by sputtering (see FIG. 23E). Then, nickel film 14, which is a conductive layer, is plated on seed film 13 using seed film 13 as a plating electrode (third step), and thereafter, nickel film 14 formed other than in throughholes 11, is removed by a CMP method (see FIG. 23F).

Subsequently, resist 15 is applied on seed film 13, followed by exposure of resist 15 such that it remains on each throughhole 11 as bump 16. Then, each bump 16 is plated (see FIG. 23G).

Figure 23H:
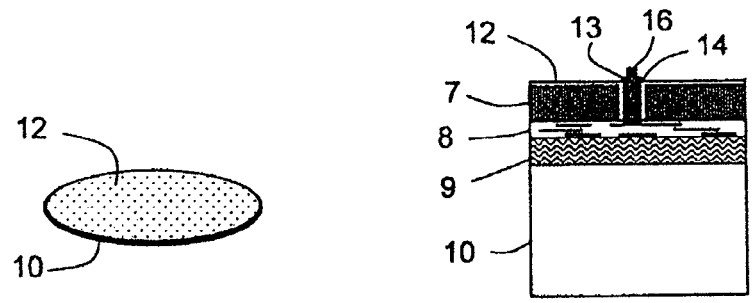
FIG. 23H is a process diagram for describing the method of manufacturing the common through electrode.

Subsequently, resist 15 is peeled off other than bumps 16, followed by removal of seed film 13 which remains on places other than within throughholes 11 (see FIG. 23H).

Subsequently, adhesive 9 and glass support 10 are peeled off from wiring layer 8 (see FIG. 23I).

Figure 23I:
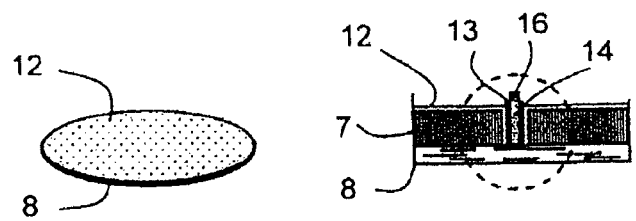
FIG. 23I is a process diagram for describing the method of manufacturing the common through electrode.
Figure 23J:
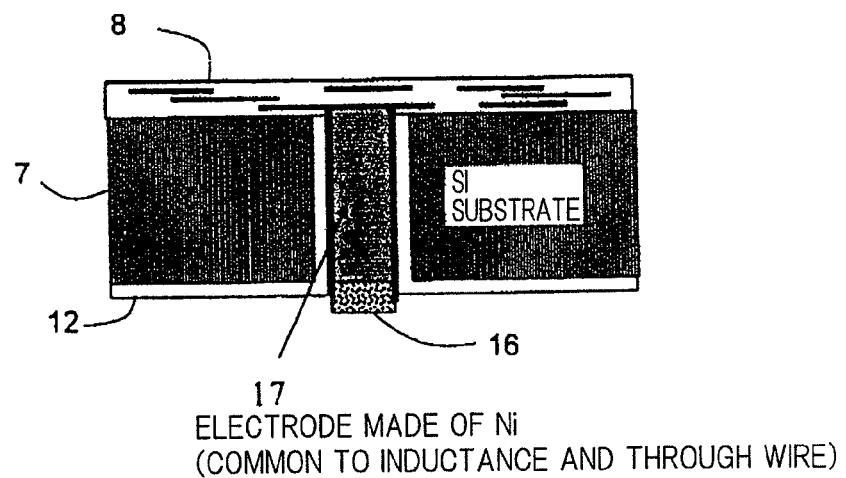
FIG. 23J is a process diagram for describing the method of manufacturing the common through electrode.

FIG. 23J is an enlarged view of a portion shown in FIG. 23I. As shown in FIG. 23J, common through electrode 17 made of nickel is produced.

As described above, the method of manufacturing a semiconductor device according to this embodiment comprises forming, on one surface of semiconductor substrate 7, throughhole 11 for use as a through wire and throughhole 11 for use as an inductor which extend from the other surface of semiconductor substrate 7 on which wiring layer 8 is formed to wiring layer 8; forming insulating layer 12 on a side surface of throughhole 11 for use as a through wire and on a side surface of throughhole 11 for use as an inductor; and forming nickel film 14, which is a conductive layer, on the bottom surface of throughhole 11 for use as a through wire, bottom surface of throughhole 11 for use as an inductor, and insulating layer 12.

Common through electrode 17 comprised of nickel film 14 is also available for use as an inductor, and is available for use as a through wire. It is therefore possible to manufacture common through electrodes 17 used for inductors and common through electrodes 17 for use as a through wires in the same step. Consequently, it is possible to simplify the step of manufacturing common through electrode 17 for use as an inductor and common through electrode 17 for use as a through wire.

It is apparent that the present invention is not limited to the above embodiments, but may be modified and changed without departing from the scope and spirit of the invention.

What is claimed is:

1. A semiconductor device comprising a pair of electromagnetically coupled inductors, each of said inductors including a plurality of through electrodes which extend through a semiconductor substrate, and wires which connect said plurality of through electrodes in series.

2. The semiconductor device according to claim 1, further comprising a magnetic core which serves as a magnetic core for said pair of inductors.

3. The semiconductor device according to claim 2, wherein said magnetic core is comprised of a plurality of partial magnetic core segments.

4. The semiconductor device according to claim 2, comprising a plurality of said magnetic cores.

5. The semiconductor device according to claim 2, wherein said magnetic core and said through electrodes are formed of the same magnetic material.

6. The semiconductor device according to claim 3, wherein said magnetic core and said through electrodes are formed of the same magnetic material.

7. The semiconductor device according to claim 4, wherein said magnetic core and said through electrodes are formed of the same magnetic material.

8. The semiconductor device according to claim 5, wherein said magnetic core and said through electrodes are formed of nickel.

9. The semiconductor device according to claim 6, wherein said magnetic core and said through electrodes are formed of nickel.

10. The semiconductor device according to claim 7, wherein said magnetic core and said through electrodes are formed of nickel.

11. The semiconductor device according to claim 2, further comprising a magnetic element arranged around said pair of inductors.

12. The semiconductor device according to claim 3, further comprising a magnetic element arranged around said pair of inductors.

13. The semiconductor device according to claim 4, further comprising a magnetic element arranged around said pair of inductors.

14. The semiconductor device according to claim 5, further comprising a magnetic element arranged around said pair of inductors.

15. The semiconductor device according to claim 6, further comprising a magnetic element arranged around said pair of inductors.

16. The semiconductor device according to claim 11, wherein said magnetic element is connected to said magnetic core.

17. The semiconductor device according to claim 11, wherein said magnetic core, said through electrodes, and said magnetic element are formed of the same magnetic material.

18. The semiconductor device according to claim 17, wherein said magnetic core, said through electrodes, and said magnetic element are formed of nickel.

19. The semiconductor device according to claim 2, wherein at least part of one of said pair of inductors is disposed within circumference formed by the other inductor.

* * * * *